(12) United States Patent
Yan

(10) Patent No.: US 12,004,340 B2
(45) Date of Patent: Jun. 4, 2024

(54) SEMICONDUCTOR MEMORY DEVICE AND METHOD FOR FORMING THE SAME

(71) Applicant: Fujian Jinhua Integrated Circuit Co., Ltd., Quanzhou (CN)

(72) Inventor: Yifei Yan, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 117 days.

(21) Appl. No.: 17/688,858

(22) Filed: Mar. 7, 2022

(65) Prior Publication Data
US 2023/0171948 A1    Jun. 1, 2023

(30) Foreign Application Priority Data

Dec. 1, 2021   (CN) .......................... 202111452104.2
Dec. 1, 2021   (CN) .......................... 202122999733.9

(51) Int. Cl.
*H10B 12/00*   (2023.01)
(52) U.S. Cl.
CPC ....... *H10B 12/315* (2023.02); *H10B 12/0335* (2023.02); *H10B 12/482* (2023.02)

(58) Field of Classification Search
None
See application file for complete search history.

(56) References Cited

U.S. PATENT DOCUMENTS

| 9,184,168 B2 | 11/2015 | Ryu |
| 9,960,167 B1 | 5/2018 | Ho |
| 2020/0365537 A1* | 11/2020 | Choi .................... H10B 12/053 |

* cited by examiner

*Primary Examiner* — Steven M Christopher
(74) *Attorney, Agent, or Firm* — Winston Hsu

(57) ABSTRACT

A semiconductor memory device including a substrate, bit lines, contacts, a dielectric layer, storage node pads and a capacitor structure. The bit lines are disposed on the substrate and include a plurality of first bit lines and at least one second bit line. The contacts are disposed on the substrate and alternately and separately disposed with the bit lines. The dielectric layer is disposed over the contacts and bit lines. The storage node pads are disposed in the dielectric layer and respectively contact the contacts. The capacitor structure is disposed on the storage node pads and includes a plurality of first capacitors and at least one second capacitor located above at least one second bit line. Therefore, the semiconductor memory device can achieve more optimized device performance.

20 Claims, 14 Drawing Sheets

SEMICONDUCTOR MEMORY DEVICE AND METHOD FOR FORMING THE SAME

BACKGROUND OF THE INVENTION

1. Field of the Invention

The present invention relates to a semiconductor memory device and the method for forming thereof, in particular to a semiconductor memory device including dynamic random access memory and the method for forming the same.

2. Description of the Prior Art

With the trend of miniaturization of various electronic products, the design of semiconductor memory devices must meet the requirements of high integration and high density. For a dynamic random access memory (DRAM) having recessed gate structures, because the carrier channel of which is relatively long in the same semiconductor substrate compared with that of the DRAM without recessed gate structures, the leakage current from the capacitor structure in the DRAM can be reduced. Therefore, the DRAM having recessed gate structures has gradually replaced DRAM having planar gate structures under the current mainstream development trend.

Generally, the DRAM having recessed gate structure is constructed by a large number of memory cells which are arranged to form an array area, and each of the memory cells can be used to store information. Each memory cell may include a transistor element and a capacitor element connected in series, which is configured to receive voltage information from word lines (WL) and bit lines (BL). In order to fulfill the requirements of advanced products, the density of memory cells in the array area must be further increased, which increases the difficulty and complexity of related fabricating processes and designs. Therefore, the present technology needs further improvement to effectively improve the performance and reliability of related memory devices.

SUMMARY OF THE INVENTION

An object of the present invention is to provide a method for forming a semiconductor memory device, in which a plurality of storage node pads are formed on a substrate through a self-aligned double patterning process or a self-aligned reverse patterning process. In this way, a subsequently formed capacitor structure may include at least a portion of capacitor located on a dummy bit line to become a dummy capacitor. With this arrangement, the semiconductor memory device may be formed on the prerequisite of simplifying the manufacturing process, and is isolated from the surrounding active devices through the arrangement of the dummy capacitor, thereby achieving the effect of optimizing the overall device performance.

To achieve the above objective, one embodiment of the present invention provides a semiconductor memory device, which includes a substrate, a plurality of bit lines, a plurality of contacts, a dielectric layer, a plurality of storage node pads and a capacitor structure. The bit lines are disposed on the substrate and include a plurality of first bit lines and at least one second bit line, and the at least one second bit line is disposed outside all the first bit lines. The contacts are disposed on the substrate and alternately and separately disposed with the bit lines. The dielectric layer is disposed over the contacts and the bit lines. The storage node pads are disposed in the dielectric layer and respectively contact the contacts. The capacitor structure is disposed on the storage node pads, and includes a plurality of first capacitors which are respectively aligned to the storage node pads, and at least one second capacitor which is located above the at least one second bit line.

To achieve the above object, one embodiment of the present invention provides a method for forming a semiconductor memory device, which includes the following steps. First, a substrate is provided, and a plurality of bit lines are formed on the substrate, in which the bit lines include a plurality of first bit lines and at least one second bit line, and the at least one second bit line is formed outside all the first bit lines. Then, a plurality of contacts are formed on the substrate, the bit lines and the contacts are alternately arranged with each other, and a dielectric layer is formed above the contacts and the bit lines to cover the contacts and the bit lines. Then, a plurality of storage node pads are formed in the dielectric layer, and the storage node pads are respectively aligned to the contacts. Then, a capacitor structure is formed on the storage node pads, in which the capacitor structure includes a plurality of first capacitors respectively aligned to the storage node pads, and at least one second capacitor located above the at least one second bit line.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic diagrams showing steps of a method for forming a semiconductor memory device in one preferred embodiment of the present invention, in which:

FIG. 1 is a schematic top view of a semiconductor memory device after forming bit lines.

FIG. 2 is a schematic cross-sectional view along the cut line A-A' in FIG. 1;

FIG. 3 is a schematic top view of a semiconductor memory device after performing a self-aligned double patterning process;

FIG. 4 is a schematic cross-sectional view along the cut line A-A' in FIG. 3;

FIG. 5 is a schematic top view of a semiconductor memory device after forming storage node pads;

FIG. 6 is a schematic cross-sectional view along the cut line A-A' in FIG. 5;

FIG. 7 is a schematic cross-sectional view along the cut line B-B' in FIG. 5;

FIG. 8 is a schematic cross-sectional view of a semiconductor memory device after forming a stacked structure;

FIG. 9 is a schematic cross-sectional view of a semiconductor memory device after forming a bottom electrode layer;

DETAILED DESCRIPTION

For better understanding of the present invention, some embodiments of the present invention are listed below with the accompanying drawings, the composition and the desired effects of the present invention are described in detail for those skilled in the art. In addition, the technical features in different embodiments described in the following may be replaced, recombined, or mixed with one another to constitute another embodiment without departing from the spirit of the present disclosure.

Figure 1:
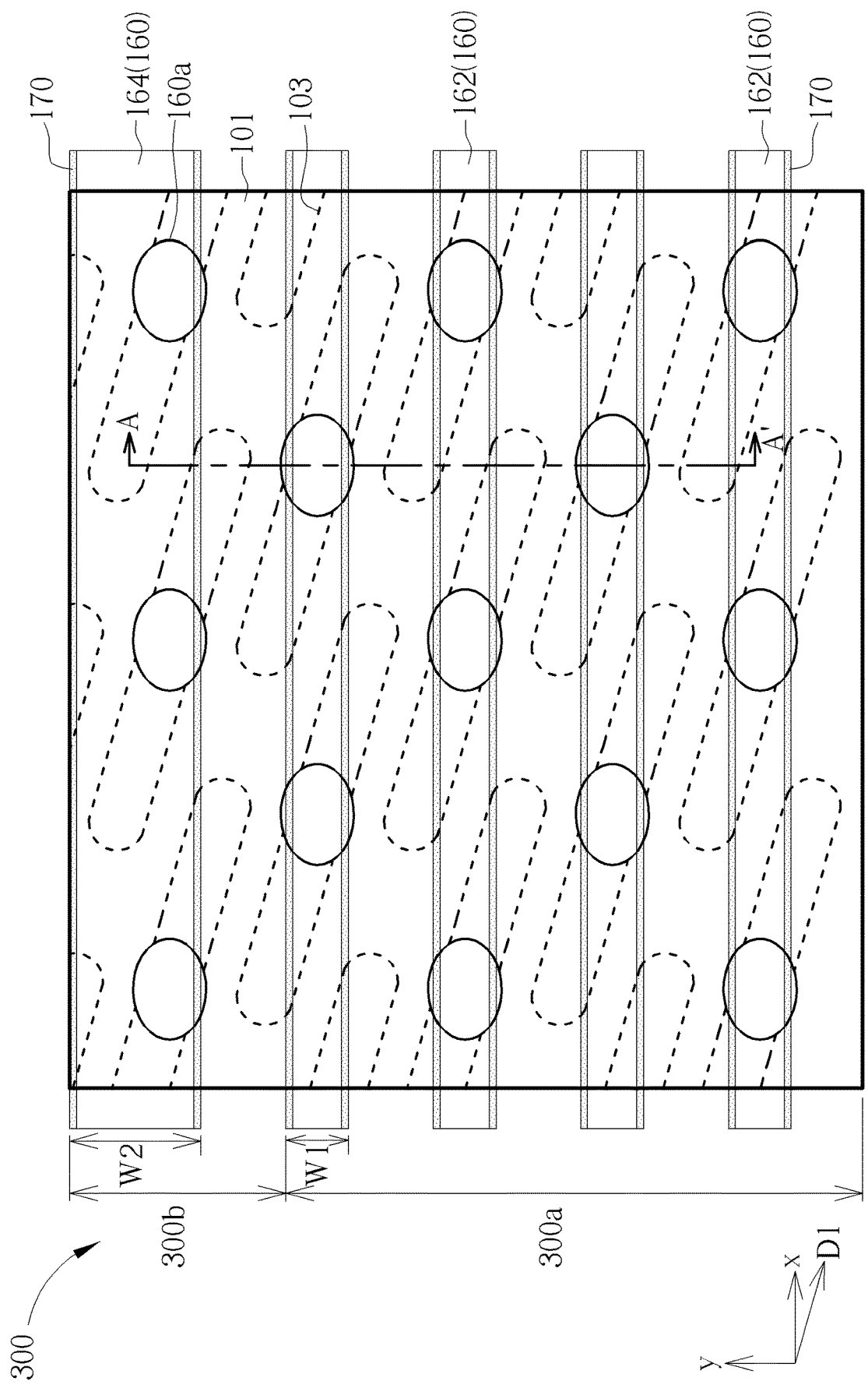

Please refer to FIGS. 1-8, which are schematic diagram showing steps of a method for forming a semiconductor memory device 300 in a first embodiment of the present invention. First, as shown in FIG. 1, a substrate 100 is provided, such as a silicon substrate, a silicon-containing substrate (such as SiC, SiGe) or a silicon-on-insulator (SOI) substrate, and at least one insulation area 101, such as a shallow trench isolation (STI), is formed in the substrate 100 to define a plurality of active areas (AAs) 103 on the substrate 100. Preferably, a plurality of active areas 103 extend parallel to each other and spaced apart from each other along a first direction D1, and are alternately disposed with each other, in which the first direction D1 intersects and is not perpendicular to the y direction or the x direction, as shown in FIG. 1. In one embodiment, the insulation area 101 is formed by etching a plurality of trenches (not shown in the drawing) in the substrate 100, and then filling the trenches with an insulating material (such as silicon oxide or silicon oxynitride), but not limited thereto.

In addition, a plurality of buried gates (not shown in the drawing) may be formed in the substrate 100, for example, the buried gates extend parallel to each other along a direction (such as y direction) and cross the active area 103, so as to serve as buried word lines (BWLs, not shown in the drawing) of the semiconductor memory device 300. A plurality of bit lines 160 and a plurality of contacts 180 (not shown in FIG. 1) may be formed on the substrate 100. For example, the bit lines 160 respectively extend in another direction (e.g., the x direction) perpendicular to the direction and cross the active area 103. Although the buried gates are not specifically depicted in the drawings of the present embodiment, it can be easily understood by those skilled in the art that the bit lines 160 extending in the x direction should be perpendicular to the buried gates extending in the y direction from a top view, and the bit lines 160 cross the active area 103 and the buried gates at the same time.

As shown in FIG. 1, the bit lines 160 further includes a plurality of first bit lines 162 and at least one second bit line 164. The first bit lines 162 and the at least one second bit line 164 are respectively disposed in a memory cell region 300a and a periphery region 300b) of the semiconductor memory device 300, and may be used as general bit lines (BLs) and dummy bit lines (dummy BLs) respectively. In particular, the at least one second bit line 164 may be located at a side outside all the first bit lines 162, but not limited thereto. It can be easily understood by those skilled in the art that, under actual requirements of devices, the memory cell region 300a and the periphery region 300b may also have other types of arrangement, and thus the first bit lines and the at least one second bit line may be adjusted to have other arrangement patterns or the at least one second bit line may be adjusted to have other numbers. For example, in one embodiment, the semiconductor memory device preferably includes two second bit lines 164, which are respectively arranged at two opposite sides (i.e., upper and lower sides) of all the first bit lines 162 to isolate other external devices. Furthermore, in the present embodiment, a line width W2 of each second bit line 164 (for example, the width in the y direction) is preferably larger than a line width W1 of each first bit line 162, but it is not limited thereto. In another embodiment, the at least one second bit line and the first bit lines may also be selectively made to have the same line width.

Figure 2:
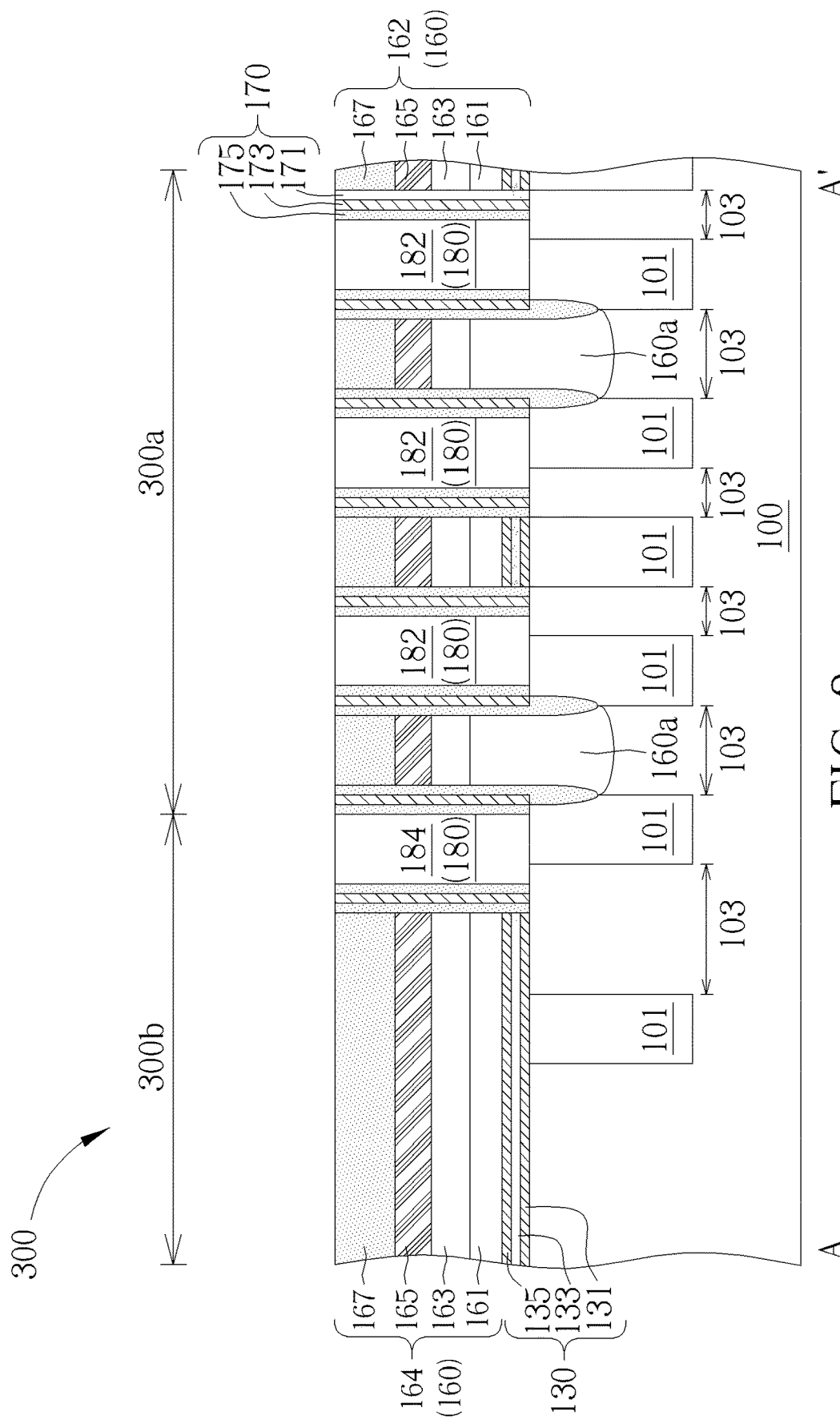

In detail, as shown in FIG. 2, each bit line 160 is formed on the substrate 100 apart from each other and includes a semiconductor layer (e.g., polysilicon) 161, a barrier layer 163 (e.g., titanium and/or titanium nitride), a conductive layer 165 (e.g., metal with low resistance such as tungsten, aluminum or copper), and a cap layer 167 (e.g., silicon oxide, silicon nitride or silicon oxynitride, etc.) stacked in sequence. It should be noted that a portion of the first bit lines 162 are formed on a dielectric layer 130 above the substrate 100, in which the dielectric layer 130 preferably has a composite layer structure, such as an oxide-nitride-oxide (ONO) structure, but not limited thereto. Another portion of the first bit lines 162 further form bit line contacts (BLCs) 160a below each of them, which extend into the substrate 100 and directly contact the substrate 100 below (the active areas 103). Furthermore, the bit line contacts 160a are integrally formed with the semiconductor layer 161 of the another portion of the first bit lines 162, as shown in FIG. 2. On the other hand, the contacts 180 are also formed on the substrate 100 separately from each other and alternately disposed with the bit lines 160. In addition, each of the contacts 180 and each of the bit lines 160 are insulated from each other through a spacer structure 170. In one embodiment, the spacer structure 170 may optionally have a single layer structure or a composite layer structure as shown in FIG. 2, which includes, for example, a first spacer 171 (for example, containing silicon nitride), a second spacer 173 (for example, containing silicon oxide) and a third spacer 173 (for example, containing silicon nitride) stacked in sequence, but not limited thereto. In addition, each of the contacts 180 further includes a plurality of first contacts 182 and at least one second contact 184, wherein the first contacts 182 are disposed in the memory cell region 300a of the semiconductor memory device 300 and directly contacts the underlying substrate 100 (including the active areas 103 and the insulation areas 101) to serve as a storage node contact (SNC) of the semiconductor memory device 300, and the second contact 184 is disposed in the periphery region 300b of the semiconductor memory device 300. In one embodiment, the contacts 180 include low resistance metal materials such as aluminum (Al), titanium (Ti), copper (Cu) or tungsten (W).

Figure 3:
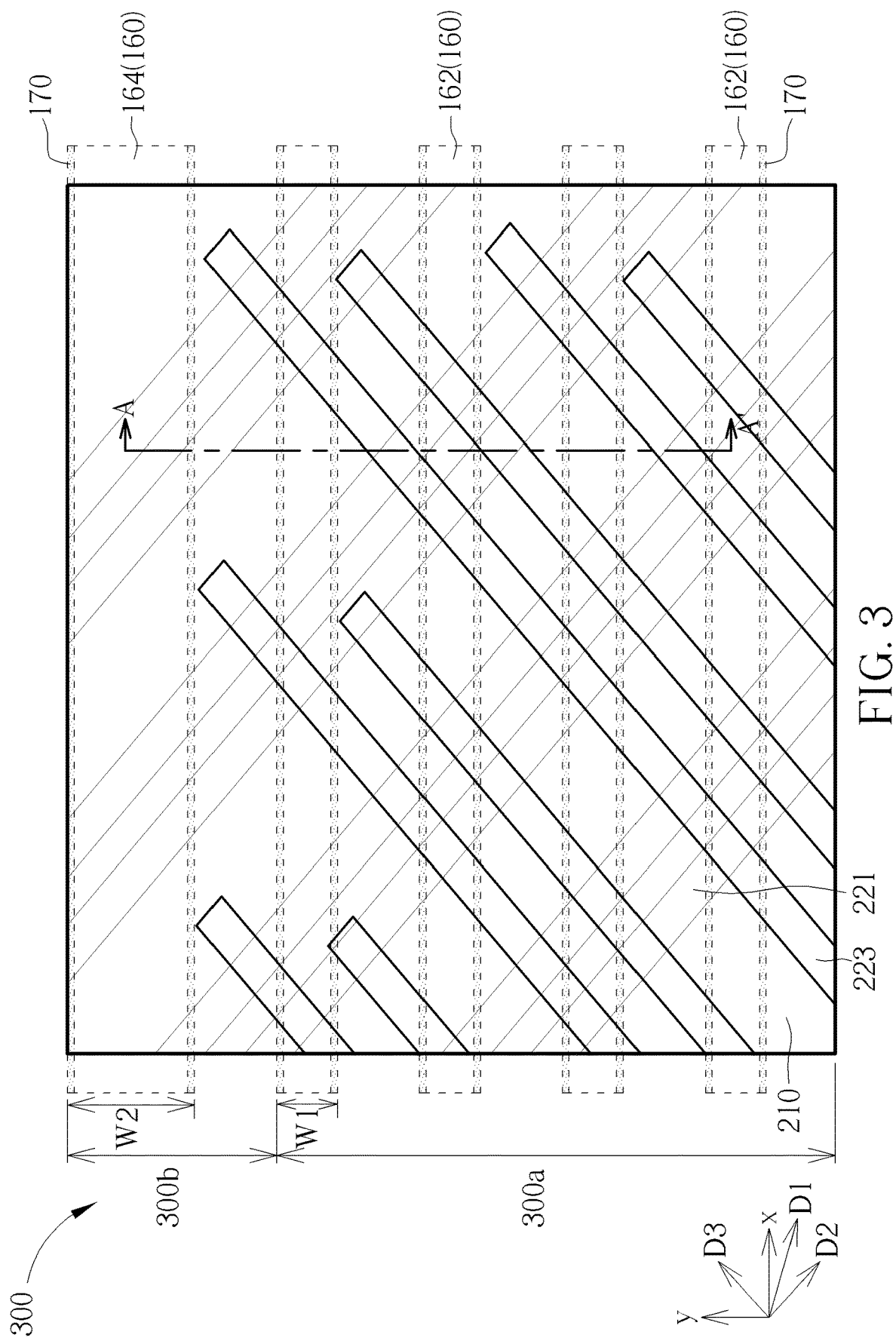
Figure 4:
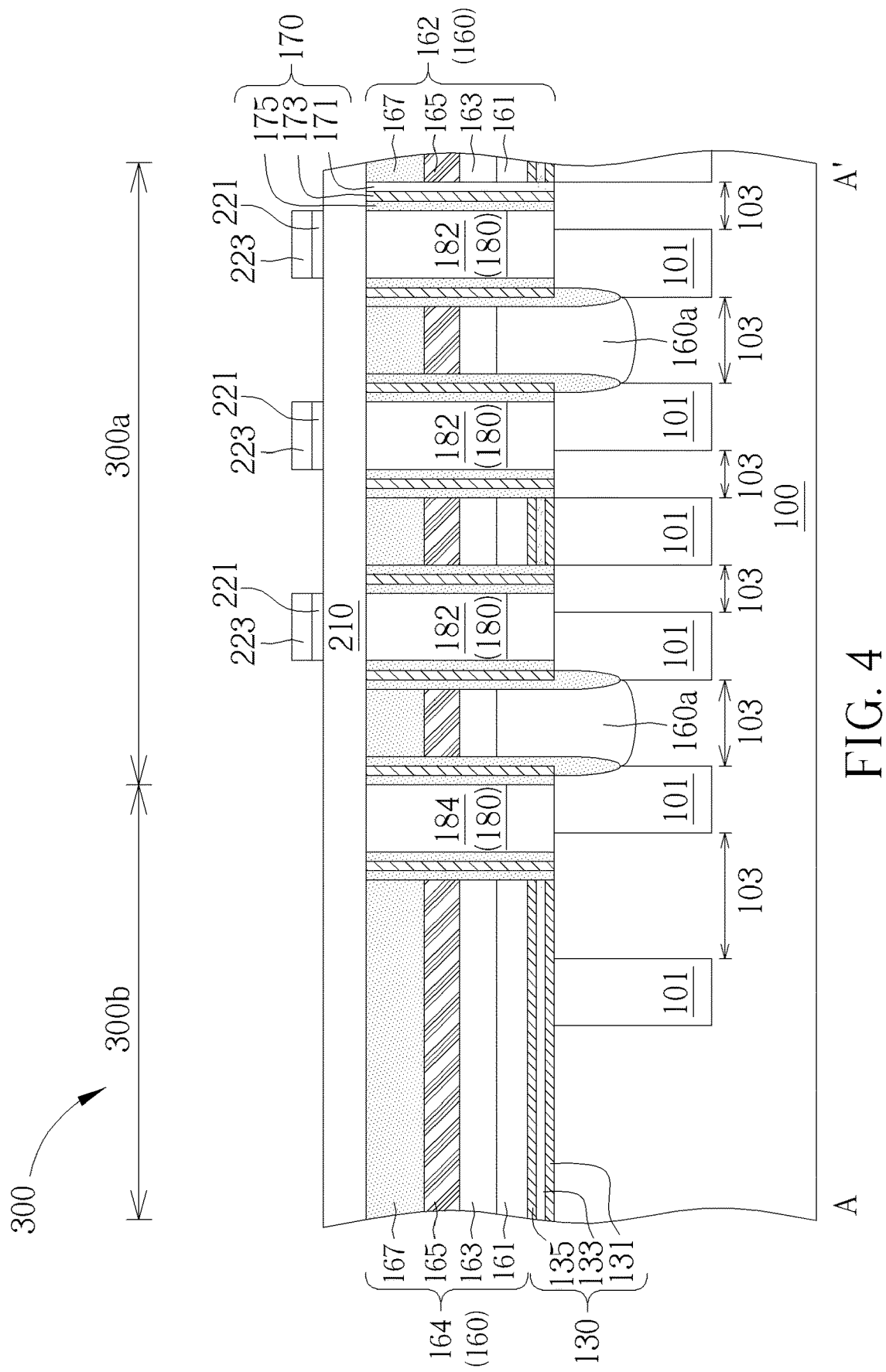
Figure 5:
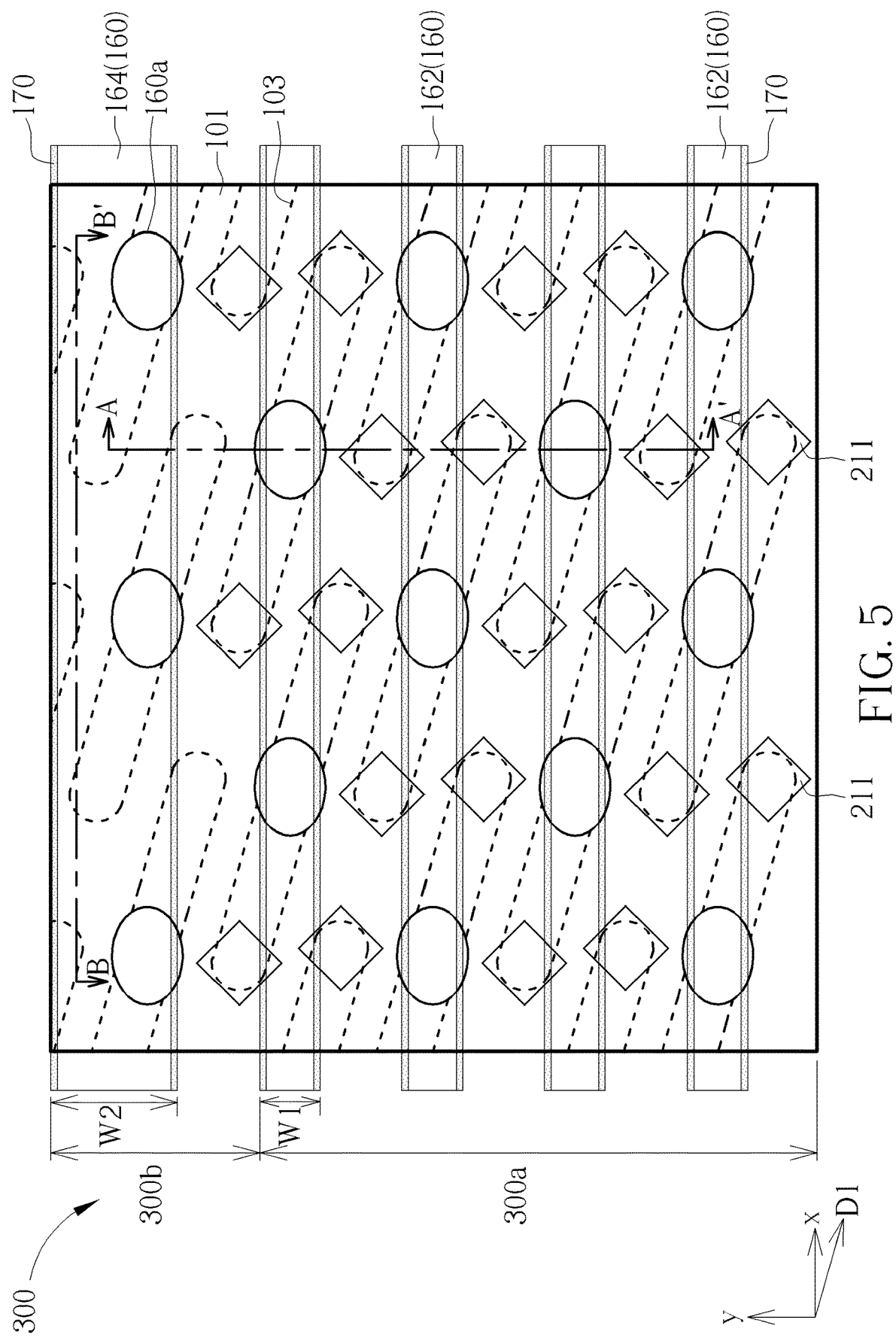
Figure 6:
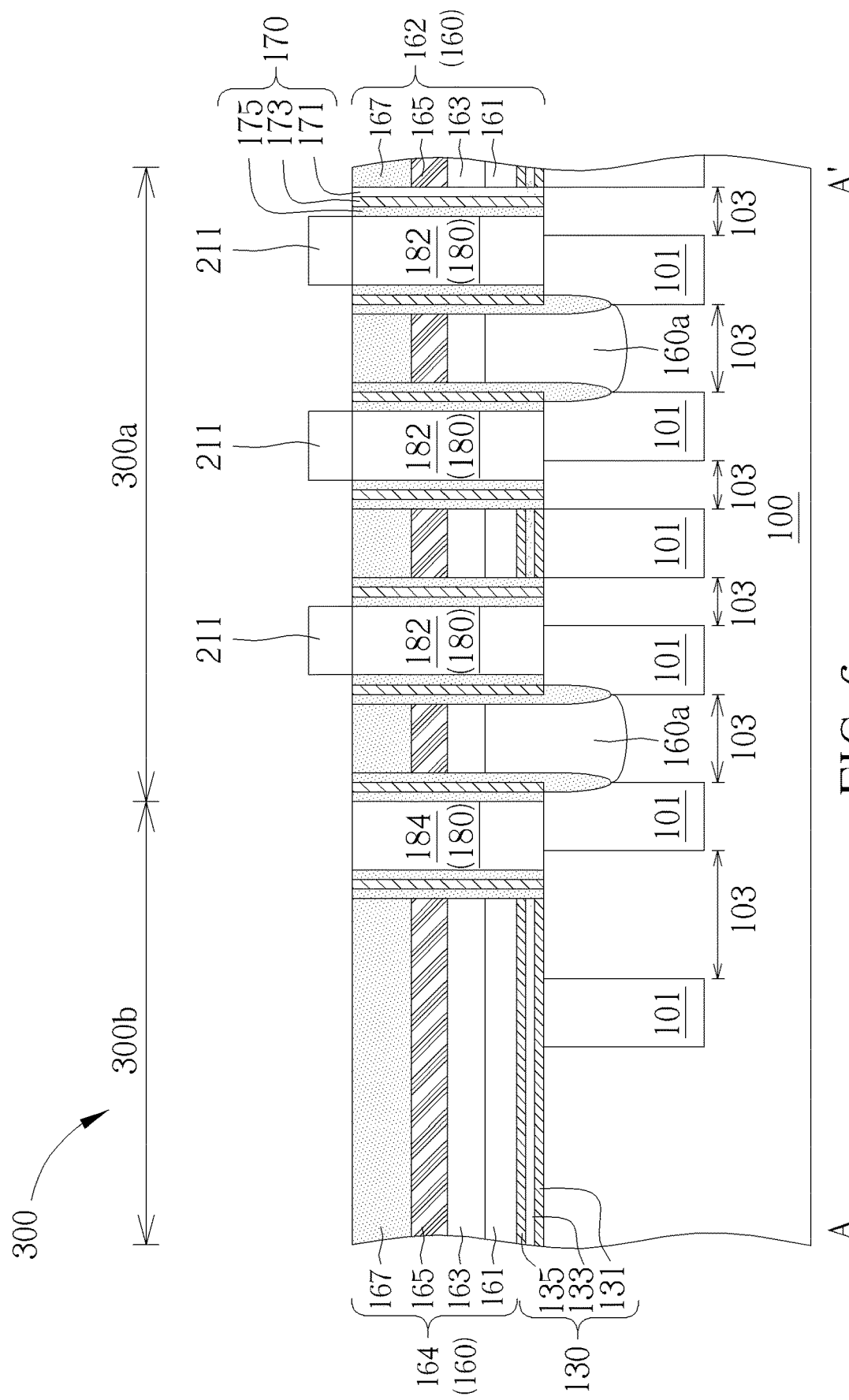
Figure 7:
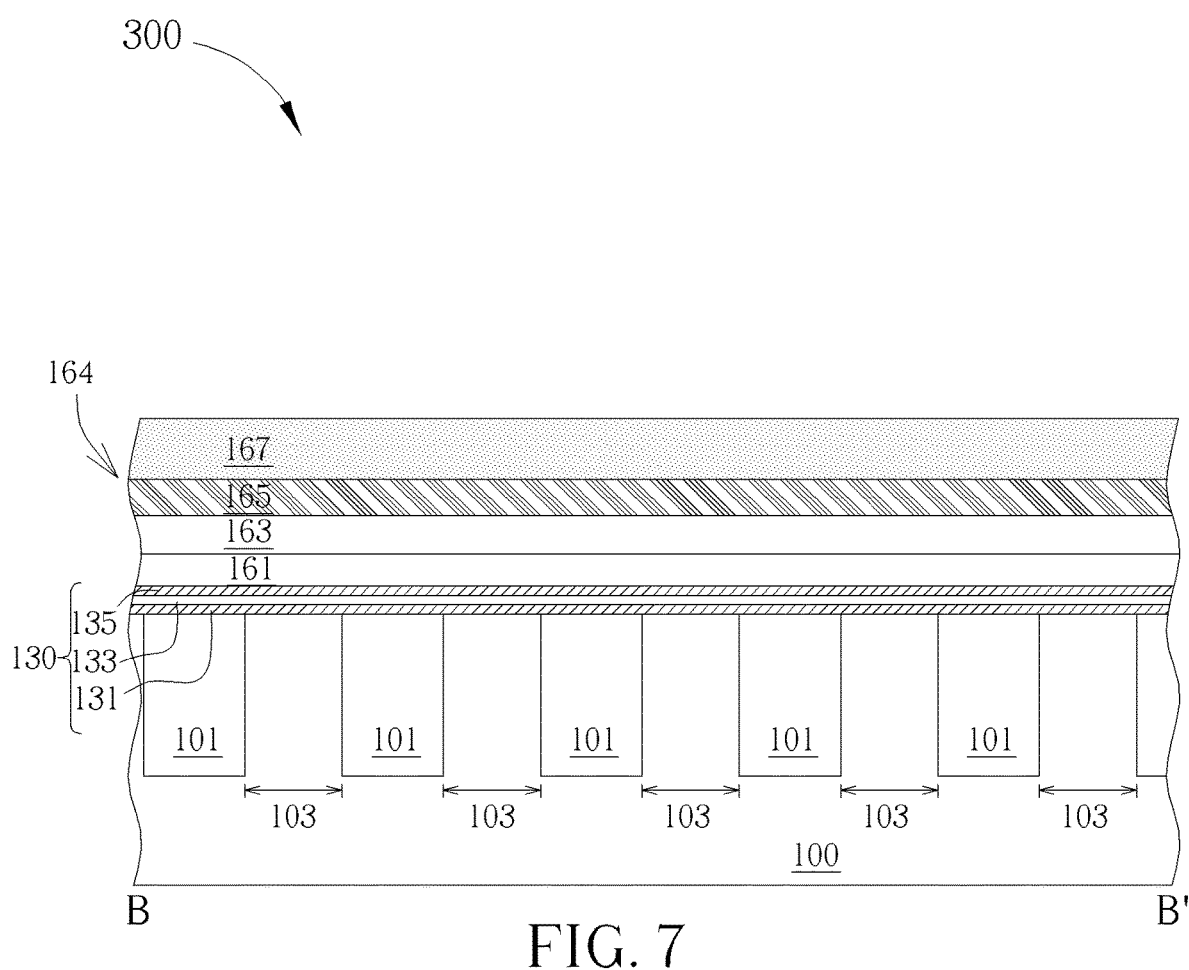

Then, a plurality of storage node pads (SN pads) 211 are formed on the substrate 100. In particular, the storage node pads 211 are formed by a self-aligned double patterning (SADP) process or a self-aligned reverse patterning (SARP) process, but not limited thereto. Referring to FIG. 3 and FIG. 4, a metal layer 210 is formed above the contacts 180 and the bit lines 160. The metal layer 210 is made of a low-resistance metal material such as aluminum, titanium, copper or tungsten, preferably a metal material different from the contacts 180, but not limited thereto. Then, at least two self-aligned double patterning processes are sequentially performed to form a plurality of patterned masks 221 extending parallel to each other along a second direction D2 and a plurality of patterned masks 223 extending parallel to each other along a second direction D3 on the metal layer 210. In particular, the second direction D2 and the second direction D3 intersect with each other and are not perpendicular to the y direction or the x direction respectively, for example, an included angle between the second direction D2 or the second direction D3 and the y direction or the x direction is about 60 to 120 degrees, as shown in FIG. 3, but not limited thereto. Then, the relative positions of the storage node pads 211 are defined by the overlapped portions between the patterned masks 221 and the patterned masks 223, and patterned masks 221, 223 are formed as etching masks to perform an etching process to pattern the underlying metal layer 210, and thus the storage node pads 211 may be formed, as shown in FIGS. 5-6. It should be noted that, the storage node pads 211 are formed by controlling the overlapping portions of the patterned masks 221 and the patterned masks 223, and a portion of the patterned masks 223 are not extended over the memory cell region 300a to form a serrated edge. Then, the storage node pads 211 formed accordingly in the present embodiment are selectively above and aligned to each of the first contacts 182 within the memory cell region 300a as shown in FIGS. 5-6, and not above the second contact 184 within the periphery region 300b as shown in FIGS. 5-6, and not above the at least one second bit line 164 as shown in FIGS. 5, 7.

Figure 8:
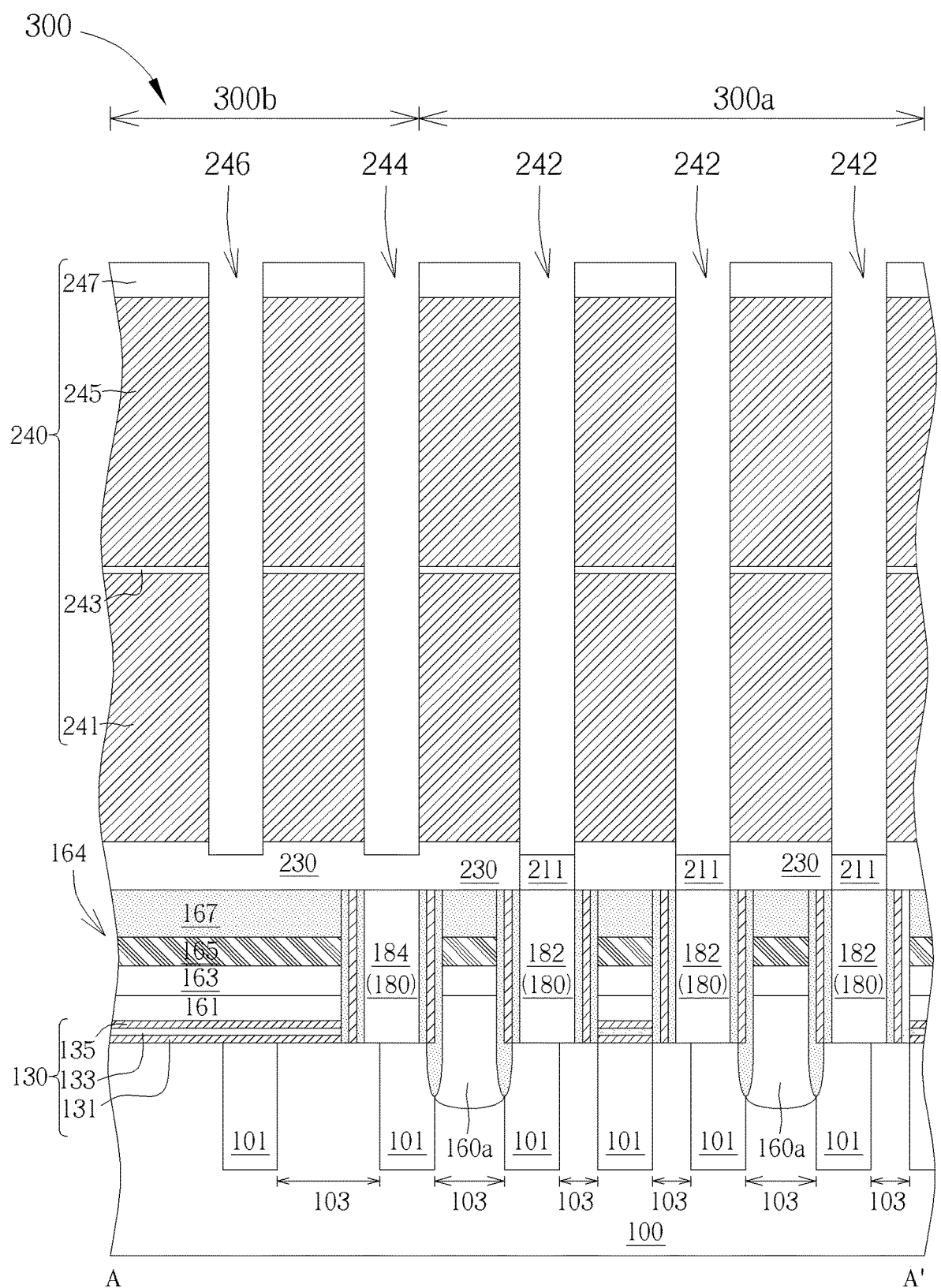

Subsequently, a capacitor structure 250 may be formed above the storage node pads 211 to directly contact and electrically connect with the storage node pads 211 below. In one embodiment, the manufacturing process of the capacitor structure 250 includes but not limited to the following steps. First, as shown in FIG. 8, a dielectric layer 230 and a supporting layer structure 240 are formed on the substrate 100. The dielectric layer 230 is disposed over the contacts 180 (including the first contacts 182 and the second contact 184) and the bit lines 160. Preferably, the thickness of the dielectric layer 230 is greater than the thickness of each of the storage node pads 211, and thus the storage node pads 211 may be located in the dielectric layer 230. The supporting layer structure 240 includes, for example, at least one oxide layer and at least one nitride layer alternately stacked. In the present embodiment, the supporting layer structure 240 includes, for example, a first supporting layer 241 (for example, including silicon oxide), a second supporting layer 243 (for example, including silicon nitride or silicon carbonitride), a third supporting layer 245 (for example, including silicon oxide) and a fourth supporting layer 247 (for example, including silicon nitride or silicon carbonitride, etc.) stacked in sequence from bottom to top, but not limited thereto. Preferably, the first supporting layer 241 and the third supporting layer 245 may have relatively large thicknesses, for example, about 5 times to 10 times more than other supporting layers (the second supporting layer 243 or the fourth supporting layer 247), but not limited thereto. Therefore, the overall thickness of the supporting layer structure 240 may reach but not limited to about 1600 angstroms to about 2000 angstroms. It should be understood by those skilled in the art that the specific stacking number of the aforementioned oxide layer (such as the first supporting layer 241 or the third supporting layer 245) and the aforementioned nitride layer (such as the second supporting layer 243 or the fourth supporting layer 247) is not limited to the aforementioned number, but may be adjusted according to actual requirements, such as 3 layers, 4 layers or other numbers. Then, a plurality of first openings 242, at least one second opening 246 and at least one third opening 244 are formed in the supporting layer structure 240, all of which sequentially penetrate through the fourth supporting layer 247, the third supporting layer 245, the second supporting layer 243, the first supporting layer 241 and part of the dielectric layer 230. The first openings 242 are disposed within the memory cell region 300, to respectively align to the storage node pads 211 (and the first contacts 182) underneath, so that the top surfaces of the storage node pads 211 may be exposed from each of the first openings 242. The at least one third opening 244 is disposed within the periphery region 300b to align to the second contact 184 underneath. However, because the bottom surfaces of the third opening 244 is lower than the top surface of the dielectric layer 230 without penetrating the dielectric layer 230, only part of the dielectric layer 230 is exposed from the at least one third opening 244. The at least one second opening 246 is also disposed within the periphery region 300b, outside all the first openings 242 and the third opening 244, wherein the at least one second opening 246 is aligned to the at least one second bit line 164 located in the periphery region 300b. The at least one second opening 246 also does not penetrate through the dielectric layer 230 to partially expose the dielectric layer 230 therefrom, as shown in FIG. 8.

Figure 9:
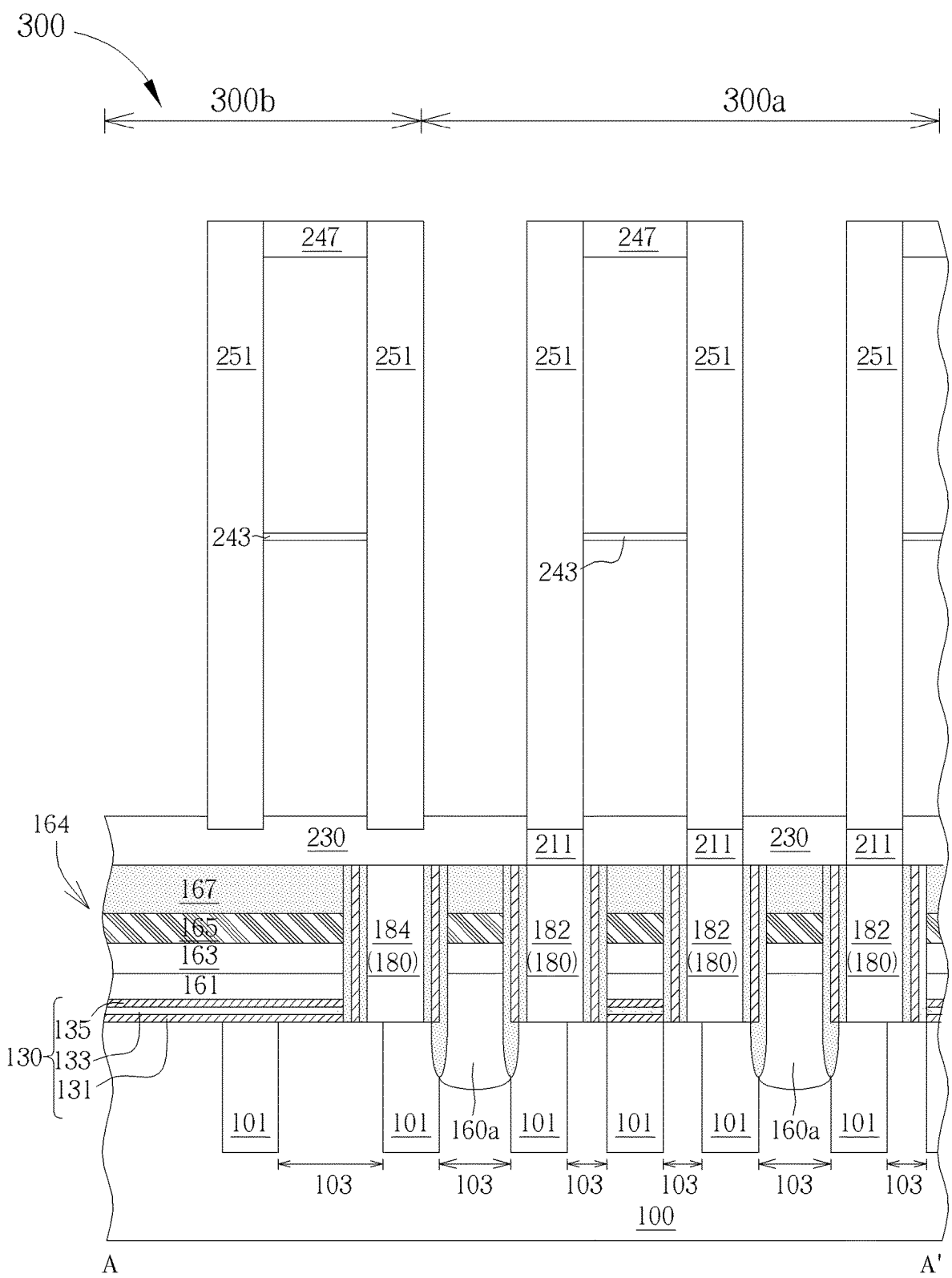

Then, as shown in FIG. 9, bottom electrode layers 251 are formed to fill the first openings 242, the at least one third opening 244 and the at least one second opening 246, respectively. In particular, each of the bottom electrode layers 251 includes a low-resistance metal material such as aluminum, titanium, copper or tungsten, and preferably titanium, but not limited thereto. It should be noted that the bottom electrode layers 251 disposed in the first openings 242 directly contact the storage node pads 211 below. The bottom electrode layers 251 disposed in the at least one third opening 244 and the at least one second opening 246 directly contact the dielectric layer 230, and are located directly above the second contact 184 and the at least one second bit line 164, respectively. As shown in FIG. 9, after the bottom electrode layers 251 are formed, an etching process is performed through a mask layer (not shown) to completely remove the oxide layer (such as the first supporting layer 241 or the third supporting layer 245) in the supporting layer structure 240 and partially remove the nitride layer (such as the second supporting layer 243 or the fourth supporting layer 247) in the supporting layer structure 240.

Figure 10:
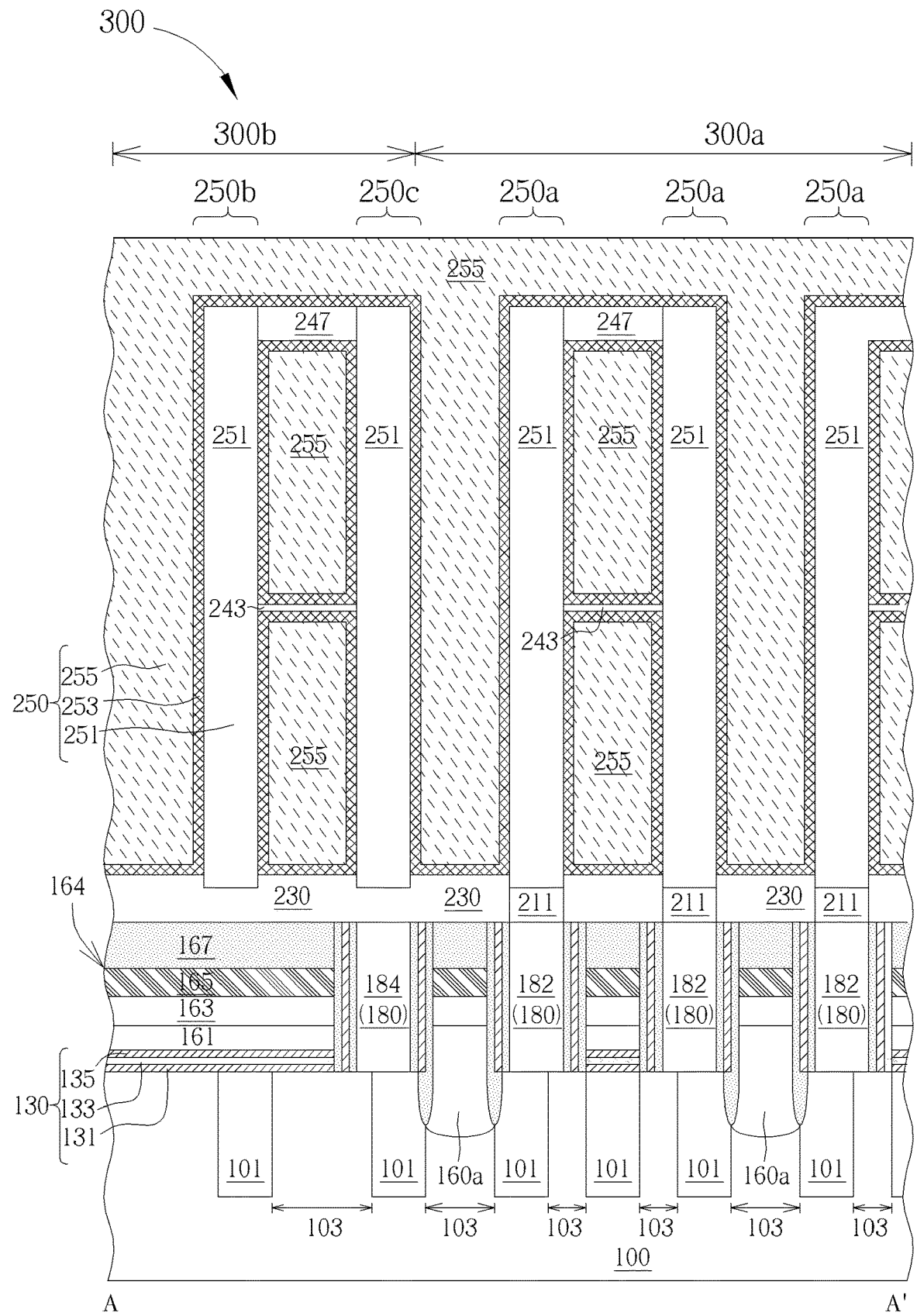
FIG. 10 is a schematic cross-sectional view of a semiconductor memory device after forming a top electrode layer.

Subsequently, as shown in FIG. 10, a capacitor dielectric layer 253 and a top electrode layer 255 are sequentially formed on the bottom electrode layers 251. In particular, part of the capacitor dielectric layer 253 and part of the top electrode layer 255 may be further filled between the remaining second supporting layer 243 and the fourth supporting layer 247, and between the remaining second supporting layer 243 and the dielectric layer 230. In one embodiment, the capacitor dielectric layer 253 includes a high dielectric constant dielectric material selected from the group consisting of hafnium oxide ($HfO_2$), hafnium silicon oxide ($HfSiO_4$), hafnium silicon oxynitride (HfSiON), zinc oxide ($ZrO_2$), titanium oxide ($TiO_2$) and zirconia-alumina-zirconia (ZAZ), and preferably includes zirconia-alumina-zirconia. The top electrode layer 255 includes low resistance metal materials such as aluminum, titanium, copper or tungsten, preferably titanium, but not limited thereto.

Thus, the manufacturing process of the capacitor structure 250 is completed. The capacitor structure 250 includes the bottom electrode layer 251, the capacitor dielectric layer 253, and the top electrode layer 255 stacked in sequence, thereby forming a plurality of vertically extending capacitors 250a, 250b, and 250c. It should be noted that the capacitor structure 250 includes a plurality of the first capacitors 250a disposed in the memory cell region 300 to align to the first contacts 182, respectively. In particular, each of the first capacitors 250a may be electrically connected with a transistor device (not shown) of the semiconductor memory device 300 through the storage node pad 211 and a storage node plug (i.e., the first contact 182) below, and each of the first capacitors 250a may thereby be used as a storage node (SN) of the semiconductor memory device 300 to maintain a good contact relationship between the capacitor structure 250 and the transistor device. On the other hand, the capacitor structure 250 further includes at least one second capacitor 250b and at least one third capacitor 250c disposed in the periphery region 300b. Since there is no storage node pad 211 disposed under the second capacitor 250b and the third capacitors 250, the second capacitor 250b and the third capacitors 250c may not be electrically connected with the storage node plug (i.e., the second contact 184) below. The bottom surfaces of the second capacitor 250b and the third capacitor 250c (i.e., the bottom surfaces of the bottom electrode layer 251 filling the third opening 244 and the second opening 246) only contact the dielectric layer 230 to form an open circuit, which become a dummy storage node (dummy SN) and are isolated from the adjacent storage nodes to maintain the overall device performance. In particular, the bottom surfaces of the second capacitor 250b and the third capacitor 250c are lower than the top surface of the dielectric layer 230, as shown in FIG. 10. In addition, the second capacitor 250b is located outside all the first capacitors 250a and the third capacitor 250c to align to the second bit line 164 in the periphery region 300b.

Figure 11:
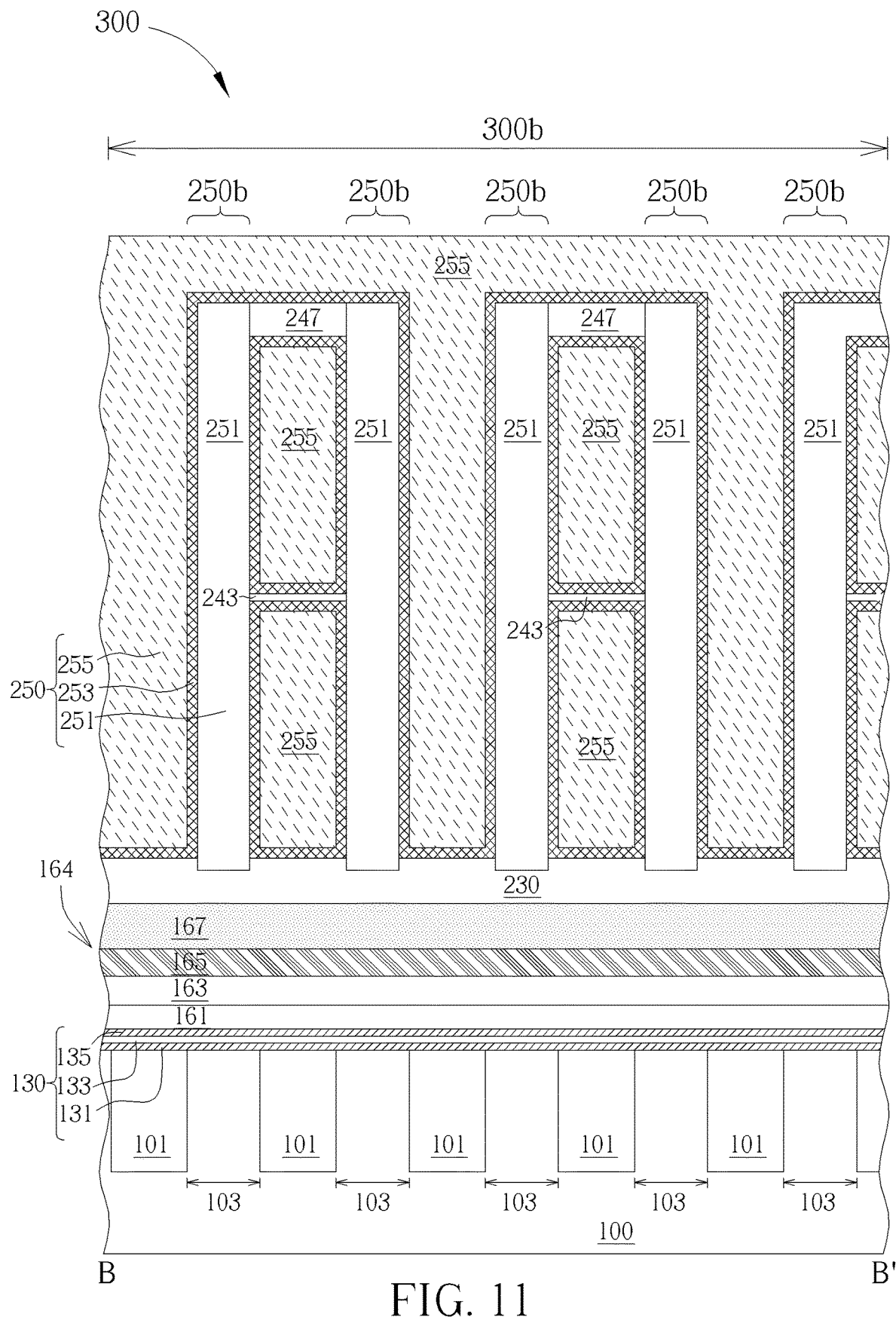
FIG. 11 is another schematic cross-sectional view of a semiconductor memory device after forming the top electrode layer.

Although the schematic cross-sectional view shown in FIG. 10 only shows that a single second capacitor 250b is located on the second bit line 164, and a single third capacitor 250c is located outside the first capacitor 250a within the periphery region 300b, it should be easily understood by those skilled in the art that a plurality of third capacitors 250c and a plurality of second capacitors 250b are disposed within the periphery region 300b. For example, if being viewed from a schematic cross-sectional view along the cross line B-B', a plurality of the second capacitors 250b is located on the second bit line 164, as shown in FIG. 11. Therefore, the semiconductor memory device 300 of the present embodiment may form a dynamic random access memory (DRAM) device, in which at least one transistor device and at least one first capacitor 250a constitute the smallest memory cell in the DRAM array to receive voltage information from the bit lines 160 and the buried word lines.

Thus, the semiconductor memory device 300 in the first embodiment of the present invention is completed. According to the forming method of the present embodiment, the storage node pads 211 are formed by controlling the overlapping parts of the patterned mask 221 and the patterned mask 223, and the storage node pads 211 are thereby disposed above the first contacts 182 within the memory cell region 300a, but not above the second contact 184 within the periphery region 300b. In this way, after the capacitor structure 250 is formed, the first capacitors 250a which may be used as storage nodes and the at least one second capacitor 250b and/or the at least one third capacitors 250c which may be used as a dummy storage node may be respectively formed. In particular, the storage nodes (i.e., the first capacitors 250a) are electrically connected with the transistor device (not shown) of the semiconductor storage device 300 through the storage node pads 211 and the storage node plugs (i.e., the first contact 182) below, while the dummy storage nodes (i.e., the at least one second capacitor 250b and/or the at least one third capacitors 250c) are not provided with the storage node pad 211 below, and thus it may not be electrically connected with the storage node plugs (i.e., the second contact 184) below. The arrangement of the dummy storage nodes may stabilize and improve the performance of the storage nodes, and may be used to isolate the adjacent storage nodes to maintain the overall device performance of the semiconductor storage device 300.

In addition, it should be easily understood by those skilled in the art that, on the prerequisite for meeting the actual product requirements, there may be other types for forming the semiconductor memory device and the method for forming thereof according to the present invention, which are not limited to the foregoing. For example, the dummy storage nodes may have other types optionally. Other embodiments or variations of the forming method of the semiconductor memory device in the present invention will be further described below. To simplify the description, the follow description mainly focuses on the difference of each embodiment, and will not repeat the same description. In addition, the same components in each embodiment of the present invention are labeled with the same reference numerals, so as to facilitate cross-reference among the embodiments.

Figure 12:
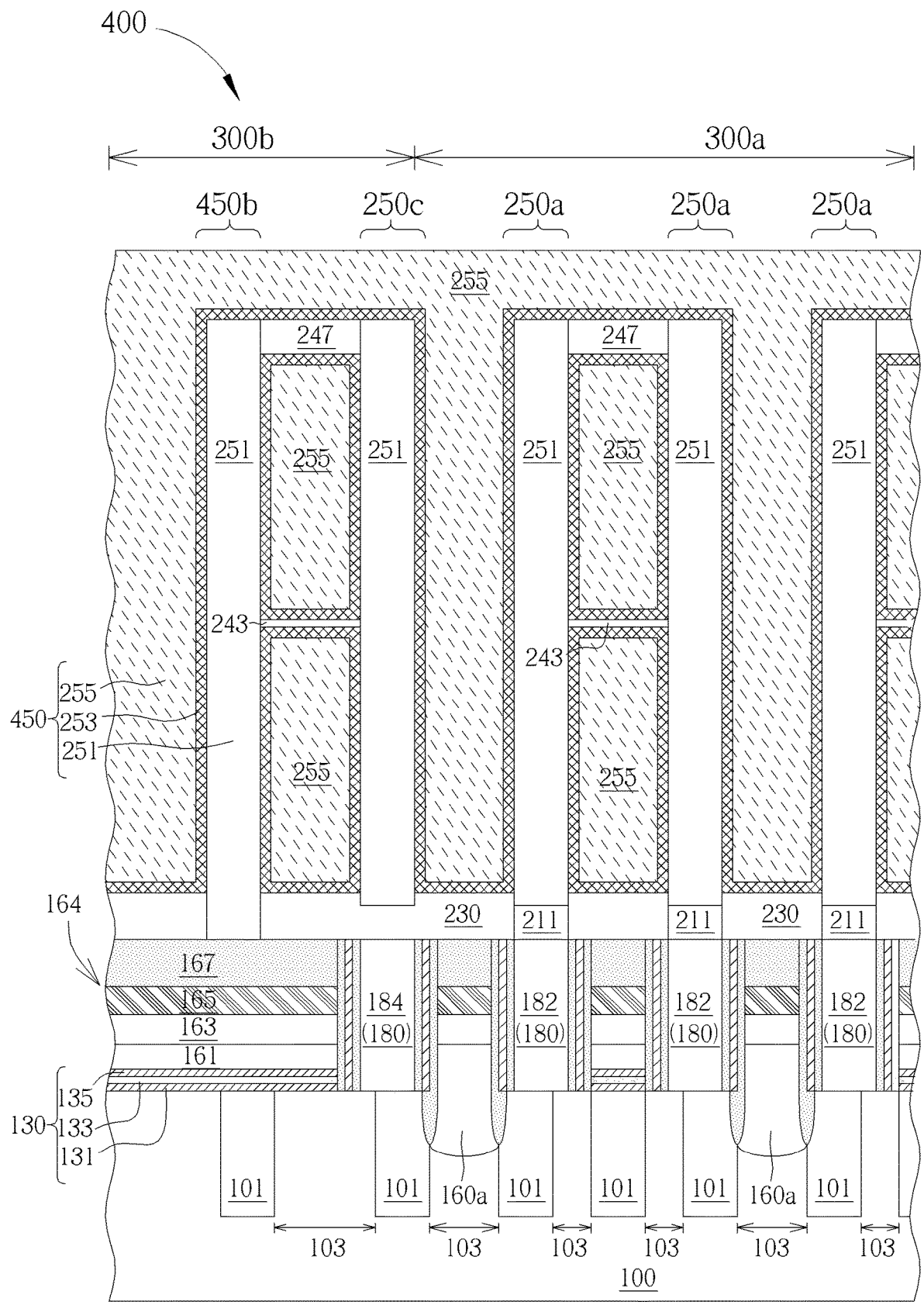
FIG. 12 is a schematic cross-sectional view of a semiconductor memory device according to a second embodiment of the present invention.

Please refer to FIG. 12, which shows steps of a method for forming a semiconductor memory device 400 in a second embodiment of the present invention. The forming steps of the front end of the semiconductor memory device 400 in the present embodiment are substantially the same as those steps of the front end of the semiconductor memory device 300 in the first embodiment described above, and will not be repeated here. The main difference between the present embodiment and the first embodiment is that at least one second capacitor 450b penetrates through the dielectric layer 230 and may directly contact the cap layer 167 of the second bit line 164.

In detail, the forming method of the present embodiment further controls the etching process conditions when forming the openings in the supporting layer structure 240, and selectively makes the second opening (not shown) aligned to the second bit line 164 penetrate the dielectric layer 230 and stop on the top surface of the cap layer 167 of the second bit line 164, therefore, the cap layer 167 of the second bit line 164 may be exposed from the second opening. Subsequently, the bottom electrode layer 251, the capacitor dielectric layer 253 and the top electrode layer 255 are sequentially formed to form the capacitor structure 450 as shown in FIG. 12. In particular, the at least one second capacitor 450b is aligned to the second bit line 164 in the periphery region 300b, and extends into the dielectric layer 230 and directly contacts the top surface of the cap layer 167 of the second bit line 164 through the bottom electrode layer 251, therefore, the at least one second capacitor 450b only contacts the dielectric layer 230 and the cap layer 167 to form an open circuit, thereby becoming the dummy storage node. Under this arrangement, the semiconductor memory device 400 of the present embodiment may also form a dynamic random access memory device, and the adjacent storage nodes are isolated by the at least one second capacitor 450b and the at least one third capacitor 250c, so as to maintain its overall device performance.

Figure 13:
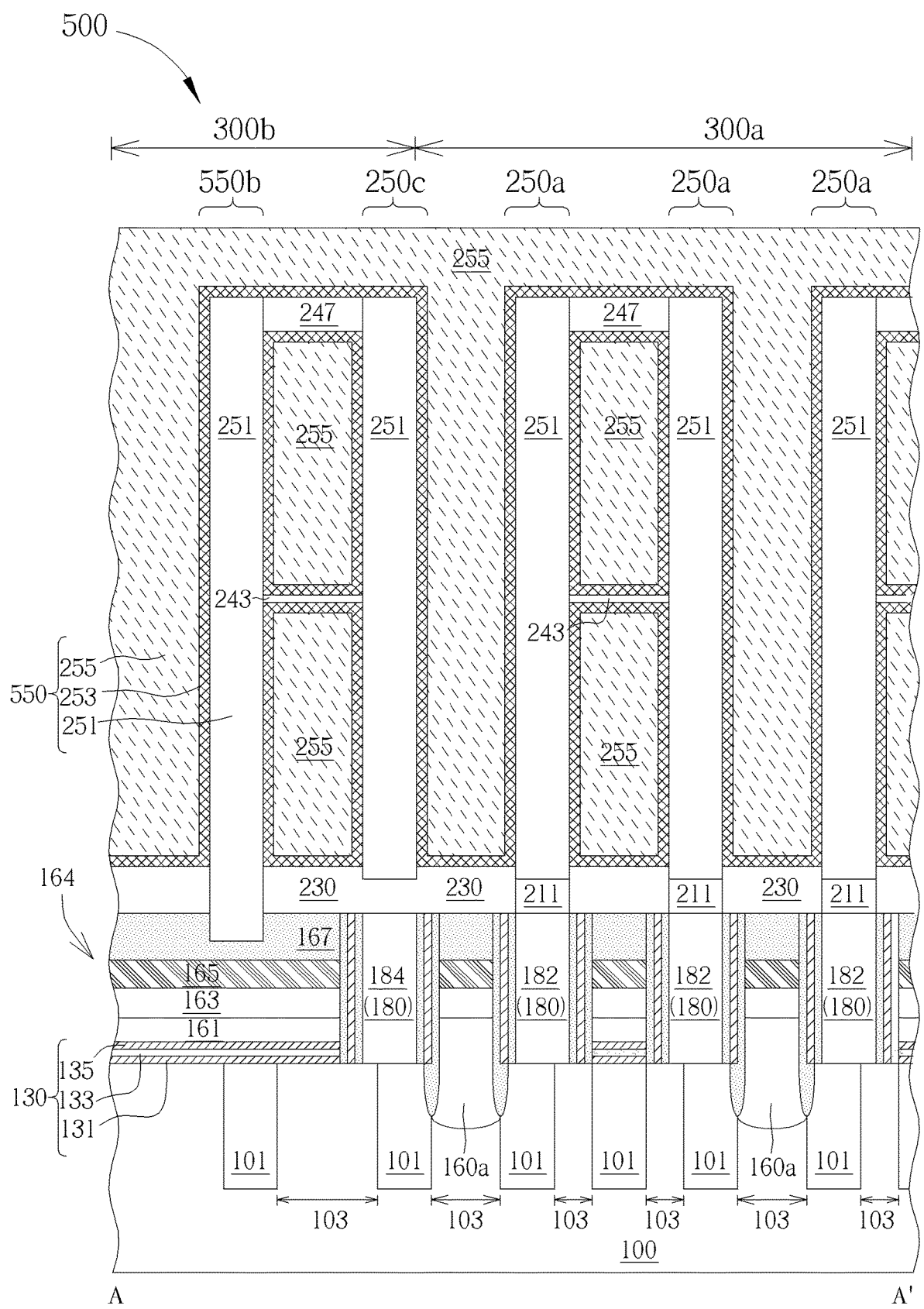
FIG. 13 is a schematic sectional view of a semiconductor memory device according to a third embodiment of the present invention.

Please refer to FIG. 13, which shows steps of a method for forming a semiconductor memory device 500 in a third embodiment of the present invention. The forming steps of the front end of the semiconductor memory device 500 in the present embodiment are substantially the same as the forming steps of the front end of the semiconductor memory device 300 in the first embodiment described above, and will not be repeated here. The main difference between the present embodiment and the first embodiment is that at least one second capacitor 550b penetrates through the dielectric layer 230 and further extends into a portion of the cap layer 167 of the second bit line 164.

In detail, the forming method of the present embodiment further controls the etching process conditions when forming the openings in the supporting layer structure 240, and selectively makes the second opening (not shown) aligned to the second bit line 164 penetrate through the dielectric layer 230 and part of the cap layer 167 of the second bit line 164, therefore, the second opening may extend into part of the cap layer 167. In other words, the bottom surface of the second opening may be lower than the top surface of the second bit line 164, and part of the cap layer 167 may be exposed from the second opening. Subsequently, the bottom electrode layer 251, the capacitor dielectric layer 253 and the top electrode layer 255 are sequentially formed to form the capacitor structure 550 as shown in FIG. 13. In particular, at least one second capacitor 550b is aligned to the second bit line 164 in the periphery region 300b, and extends into the part of the cap layer 167 through the bottom electrode layer 251 and directly contacts the second bit line 164. The bottom surface of at least one second capacitor 550b (that is, the bottom surface of the bottom electrode layer 251 filling the second opening) may be lower than the top surface of the second bit line 164, and the at least one second capacitor 550b only contacts the cap layer 167 to form an open circuit, thereby becoming the dummy storage node. Under this arrangement, the semiconductor memory device 500 of the present embodiment may also form a dynamic random access memory device, and the adjacent storage nodes are isolated by the second capacitor 550b and the third capacitors 250c, so as to maintain its overall device performance.

Figure 14:
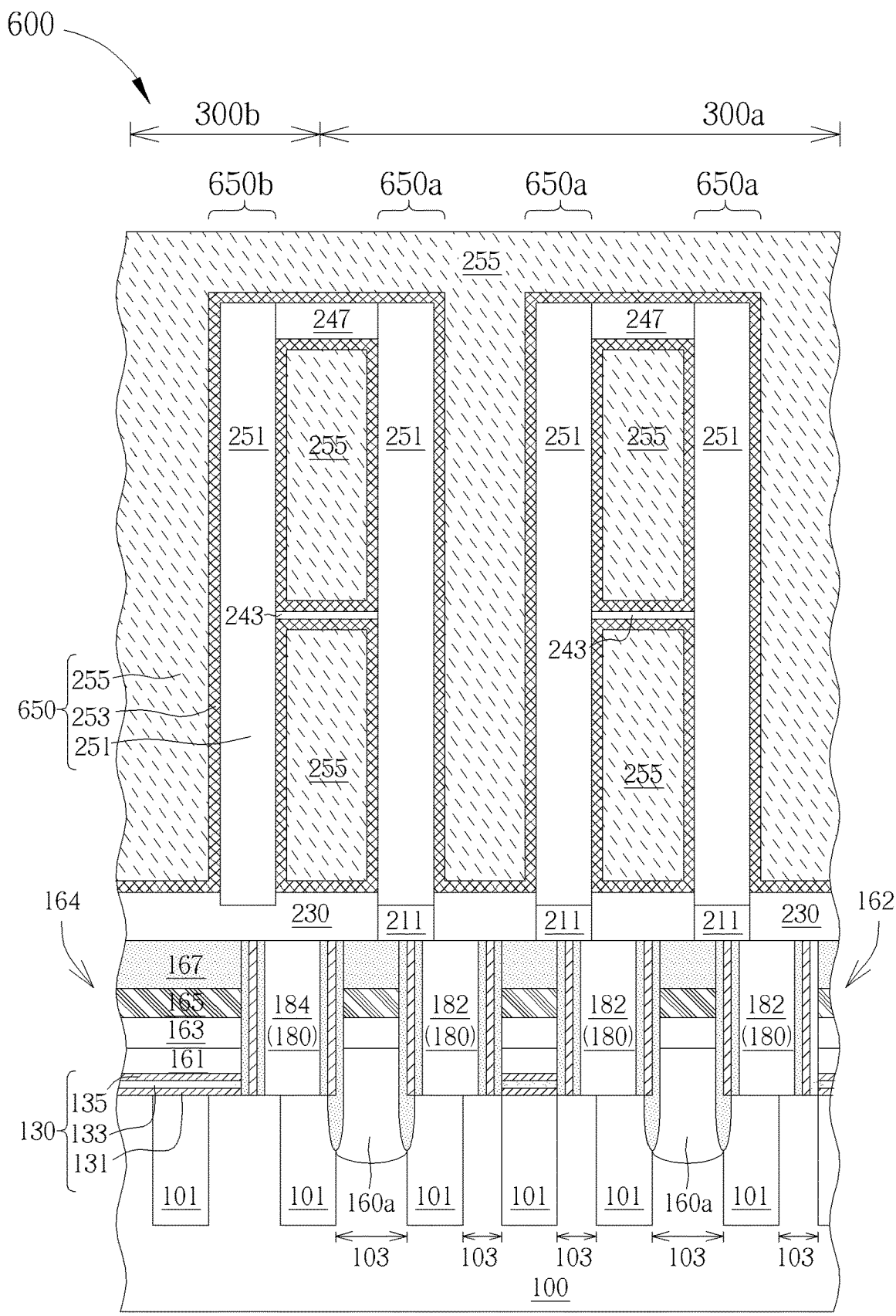
FIG. 14 is a schematic sectional view of a semiconductor memory device according to a fourth embodiment of the present invention.

Please refer to FIG. 14, which shows steps of a method for forming a semiconductor memory device 600 in a fourth embodiment of the present invention. The forming steps of the front end of the semiconductor memory device 600 in the present embodiment are substantially the same as the forming steps of the front end of the semiconductor memory device 300 in the first embodiment described above, and will not be repeated here. The main difference between the present embodiment and the first embodiment is that at least one second capacitor 650b is located above part of the second bit line 164 and part of the contact 180 at the same time.

In detail, as shown in FIG. 14, during the process of forming the storage node pads 211, each of the storage node pads 211 only partially overlaps with the underlying first contact 182 so that a larger process window can be obtained. Subsequently, the bottom electrode layer 251, the capacitor dielectric layer 253 and the top electrode layer 255 are formed in sequence to form a capacitor structure 650 as shown in FIG. 14. In this way, each of the storage node pads 211 may be located above a part of each first contact 182, the spacer structure 170 and a part of each first bit line 162 at the same time, and the first capacitor 650a formed later may also be located above the part of each first contact 182, the spacer structure 170 and the part of each first bit line 162 accordingly. In addition, the second capacitor 650b located in the periphery region 300b may be located above a part of the second contact 184, the spacer structure 170 and a part of the second bit line 164 at the same time. It should be noted that in the present embodiment, the etching process conditions may be further controlled to selectively make the opening (not shown) located in the peripheral region 300b only partially penetrate the dielectric layer 230, so as to make the bottom surface of the second capacitor 650b (that is, the bottom surface of the bottom electrode layer 251 filling the opening) only contact the dielectric layer 230, as shown in FIG. 14, but not limited thereto. Under this arrangement, the semiconductor memory device 600 of the present embodiment may also form a dynamic random access memory device, and the adjacent storage nodes are isolated by the second capacitor 650b, so as to maintain its overall device performance.

In general, the present invention forms the storage node pads on the substrate through the self-aligned double patterning process or the self-aligned reverse patterning process, and forms the storage node pads only within the memory cell region to align to the contacts by controlling the overlapping parts of the patterning masks. In this way, after the capacitor structure is formed, the first capacitors that may be used as storage nodes and the second capacitor that may be used as a dummy storage node may be respectively formed, in which the storage nodes (i.e., the first capacitor) are electrically connected with the transistor device (not shown) of the semiconductor storage device through the storage node pads and the storage node plugs (i.e., the contacts) below. While there is no storage node pad under the dummy storage node (i.e., the second capacitor), instead, the dummy storage node directly contacts the cap layer of the dummy bit line, and are thereby not electrically connected with the storage node plug (i.e., the contact), so that the adjacent storage nodes may be isolated to maintain the overall device performance of the semiconductor storage device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a substrate, having a cell region and a periphery region;
a plurality of bit lines, disposed on the substrate, wherein the bit lines comprise a plurality of first bit lines within the cell region and at least one second bit line within the periphery region, the at least one second bit line being disposed outside all of the first bit lines, wherein the at least one second bit line is a dummy bit line;
a plurality of contacts, disposed on the substrate, and alternatively and separately disposed with the bit lines;
a dielectric layer, disposed over the contacts and the bit lines;
a plurality of storage node pads, disposed in the dielectric layer and respectively connected to the contacts; and
a capacitor structure, disposed on the storage node pads, the capacitor structure comprises a plurality of first capacitors and at least one second capacitor, the plurality of first capacitors being respectively aligned with the storage node pads, and the at least one second capacitor being located over the at least one second bit line.

2. The semiconductor memory device of claim 1, wherein a bottom surface of the at least one second capacitor is in direct contact with the dielectric layer.

3. The semiconductor memory device of claim 1, wherein the at least one second capacitor is located over a portion of one of the contacts and a portion of the at least one second bit line simultaneously.

4. The semiconductor memory device of claim 1, wherein each of the bit lines comprises a semiconductor layer, a barrier layer, a conductive layer and a cap layer sequentially stacked from bottom to top, and the at least one second capacitor is in direct contact with the cap layer of the at least one second bit line.

5. The semiconductor memory device of claim 4, wherein the at least one second capacitor is extended into the cap layer of the at least one second bit line.

6. The semiconductor memory device of claim 1, wherein a bottom surface of the at least one second capacitor is lower than a top surface of the at least one second bit line.

7. The semiconductor memory device of claim 1, wherein a width of the at least one second bit line is larger than a width of the first bit lines.

8. The semiconductor memory device of claim 1, wherein the capacitor structure further comprises at least one third capacitor respectively located corresponding to the contacts, and the third capacitors are in direct contact with the dielectric layer.

9. The semiconductor memory device of claim 8, wherein the at least one third capacitor is disposed outside all of the first capacitors, and the at least one third capacitor is disposed between the first capacitors and the at least one second capacitor.

10. The semiconductor memory device of claim 8, wherein a bottom surface of the at least one third capacitor is lower than a top surface of the dielectric layer.

11. A semiconductor memory device, comprising:
a substrate;
a plurality of bit lines, disposed on the substrate, wherein the bit lines comprise a plurality of first bit lines and at least one second bit line, the at least one second bit line being disposed outside all of the first bit lines;
a plurality of contacts, disposed on the substrate, and alternatively and separately disposed with the bit lines;
a dielectric layer, disposed over the contacts and the bit lines;
a plurality of storage node pads, disposed in the dielectric layer and respectively connected to the contacts; and
a capacitor structure, disposed on the storage node pads, the capacitor structure comprises a plurality of first capacitors and at least one second capacitor, the plurality of first capacitors being respectively aligned with the storage node pads, and the at least one second capacitor being located over the at least one second bit line, wherein the at least one second capacitor is isolated from any one of the contacts.

12. The semiconductor memory device of claim 11, wherein a bottom surface of the at least one second capacitor is in direct contact with the dielectric layer.

13. The semiconductor memory device of claim 11, wherein the at least one second capacitor is located over a portion of one of the contacts and a portion of the at least one second bit line simultaneously.

14. The semiconductor memory device of claim 11, wherein each of the bit lines comprises a semiconductor layer, a barrier layer, a conductive layer and a cap layer sequentially stacked from bottom to top, and the at least one second capacitor is in direct contact with the cap layer of the at least one second bit line.

15. The semiconductor memory device of claim 14, wherein the at least one second capacitor is extended into the cap layer of the at least one second bit line.

16. The semiconductor memory device of claim 11, wherein a bottom surface of the at least one second capacitor is lower than a top surface of the at least one second bit line.

17. The semiconductor memory device of claim 11, wherein a width of the at least one second bit line is larger than a width of the first bit lines.

18. The semiconductor memory device of claim 11, wherein the capacitor structure further comprises at least one third capacitor respectively located corresponding to the contacts, and the third capacitors are in direct contact with the dielectric layer.

19. The semiconductor memory device of claim 18, wherein the at least one third capacitor is disposed outside all of the first capacitors, and the at least one third capacitor is disposed between the first capacitors and the at least one second capacitor.

20. A semiconductor memory device, comprising:
a substrate;
a plurality of bit lines, disposed on the substrate, wherein the bit lines comprise a plurality of first bit lines and at least one second bit line, the at least one second bit line being disposed outside all of the first bit lines;
a plurality of contacts, disposed on the substrate, and alternatively and separately disposed with the bit lines;
a dielectric layer, disposed over the contacts and the bit lines;
a plurality of storage node pads, disposed in the dielectric layer and respectively connected to the contacts; and
a capacitor structure, disposed on the storage node pads, the capacitor structure comprises a plurality of first capacitors and at least one second capacitor, the plurality of first capacitors being respectively aligned with the storage node pads, and the at least one second capacitor being located over the at least one second bit line,
wherein each of the bit lines comprises a semiconductor layer, a barrier layer, a conductive layer and a cap layer sequentially stacked from bottom to top, and the at least one second capacitor is in direct contact with the cap layer of the at least one second bit line.

\* \* \* \* \*